US011034519B2

(12) United States Patent
Sai et al.

(10) Patent No.: US 11,034,519 B2
(45) Date of Patent: Jun. 15, 2021

(54) ARTICLE PLACEMENT APPARATUS, STOCKER PROVIDED THEREWITH, AND TRANSPORT VEHICLE SYSTEM

(71) Applicant: MURATA MACHINERY, LTD., Kyoto (JP)

(72) Inventors: Jun Sai, Ise (JP); Keisuke Sakata, Ise (JP); Kenji Ota, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 184 days.

(21) Appl. No.: 16/430,462

(22) Filed: Jun. 4, 2019

(65) Prior Publication Data

US 2019/0375593 A1 Dec. 12, 2019

(30) Foreign Application Priority Data

Jun. 11, 2018 (JP) .............................. JP2018-111347

(51) Int. Cl.
*G06F 7/00* (2006.01)
*B65G 1/137* (2006.01)
*B65G 1/06* (2006.01)

(52) U.S. Cl.
CPC ........... *B65G 1/1375* (2013.01); *B65G 1/065* (2013.01)

(58) Field of Classification Search
USPC ......................... 700/213–214, 218, 228, 230
See application file for complete search history.

(56) References Cited

U.S. PATENT DOCUMENTS

| 5,017,066 A | * | 5/1991 | Tylisz | ....................... B60P 7/13 |
| | | | | 105/355 |
| 2006/0066696 A1 | * | 3/2006 | Matsumoto | ............ B41J 2/1752 |
| | | | | 347/86 |
| 2007/0262686 A1 | * | 11/2007 | Ji | .......................... A47B 88/90 |
| | | | | 312/402 |
| 2019/0160805 A1 | * | 5/2019 | Wang | .................... B32B 43/006 |
| 2019/0248581 A1 | | 8/2019 | Adachi | |
| 2020/0140198 A1 | * | 5/2020 | Bacon-Maldonado, III | ................ |
| | | | | B65G 15/44 |

FOREIGN PATENT DOCUMENTS

| JP | 59-143339 U | 9/1984 |
| JP | 2010-013240 A | 1/2010 |
| JP | 2015-202921 A | 11/2015 |
| JP | 2015-214407 A | 12/2015 |
| JP | 2017-186115 A | 10/2017 |
| WO | 2018/066230 A1 | 4/2018 |

* cited by examiner

*Primary Examiner* — Yolanda R Cumbess
(74) *Attorney, Agent, or Firm* — Keating & Bennett, LLP

(57) ABSTRACT

An article placement apparatus, a stocker provided including the article placement apparatus, and a transport vehicle system, prevent an article from being damaged at time of placement of the article, even when an erector vertically erecting from the support is provided. The article placement apparatus includes a support on which the storage container is placed, and a side erector that vertically erects from the support and extends in a transfer direction of the storage container, the side erector restricting the storage container placed on the support from moving in a width direction that is horizontally orthogonal to the transfer direction. The side erector is provided with a guide that guides the storage container obliquely upward from the front side toward the rear side when the storage container transferred by the stacker crane comes into contact.

7 Claims, 8 Drawing Sheets

ARTICLE PLACEMENT APPARATUS, STOCKER PROVIDED THEREWITH, AND TRANSPORT VEHICLE SYSTEM

CROSS REFERENCE TO RELATED APPLICATIONS

This application claims the benefit of priority to Japanese Patent Application No. 2018-111347 filed on Jun. 11, 2018. The entire contents of this application are hereby incorporated herein by reference.

BACKGROUND OF THE INVENTION

1. Field of the Invention

The present invention relates to an article placement apparatus, a stocker provided with the article placement apparatus, and a transport vehicle system.

2. Description of the Related Art

There is known a stocker including a rack, on which a storage container for storing objects to be stored, such as semiconductor wafers and glass substrates, is placed, in an internal space defined by a main body such as a partition, and a transfer device such as a stacker crane capable of transferring the objects to be stored onto the rack (e.g., Unexamined Japanese Patent Publication No. 2015-214407). There is also known a load port as an interface portion in which a storage container is delivered to a stocker as above or a predetermined processing device (e.g., Unexamined Japanese Patent Publication No. 2017-186115). On the rack of the stocker or an article placement apparatus of the load port as thus described, the transfer device places an article such as a storage container from one horizontal direction.

As illustrated in FIG. 8, such an article placement apparatus 250 (250A, 250B) may be provided with an erecting part 253 that vertically erects from a placement part 251, on which a storage container (an article) 290 is placed, and restricts the movement of the storage container 290 in a width direction (an X direction) orthogonal to the one direction (a Y direction) so that, for example, the erecting part 253 is attached to a column 241 or to serve as a partition from an adjacent article placement apparatus 250. However, when a transfer device (not illustrated) stops in the state of being shifted in the width direction (the X direction) with respect to a position of the article placement apparatus 250 where the transfer device is to stop and attempts to transfer the storage container 290 in that state, the storage container 290 collides with the erecting part 253. As a result, the storage container 290 may be pinched between the transfer device and the erecting part 253 and damaged.

SUMMARY OF THE INVENTION

Accordingly, preferred embodiments of the present invention provide article placement apparatuses, stockers provided with the article placement apparatuses, and transport vehicle systems, each of which are capable of preventing an article from being damaged at the time of placement of the article, even when an erector vertically erecting from an article support is provided.

An article placement apparatus according to a preferred embodiment of the present invention is an article placement apparatus onto which an article is transferred by a transfer device, the article placement apparatus including a support on which the article is placed, and an erector that vertically erects from the support and extends in a transfer direction of the article, the erector regulating the article placed on the support from moving in a width direction that is horizontally orthogonal to the transfer direction. When a side on which the transfer device is disposed as viewed from the article placement apparatus is taken as a front side in the transfer direction and a side opposite to the front side is taken as a rear side in the transfer direction, the erector is provided with a guide that guides the article obliquely upward from the front side toward the rear side at the time when the article transferred by the transfer device comes into contact.

In the article placement apparatus with this configuration, even when the transfer device stops in the state of being shifted in the width direction from a position of the article placement apparatus where the transfer device is to stop and transfers the container in that state, the article is guided by the guide obliquely upward from the front side toward the rear side. This prevents the article from being pinched between the transfer device and the erector and damaged. As a result, even when the erector is provided, it is possible to prevent the article from being damaged at the time of placement of the article.

In an article placement apparatus according to a preferred embodiment of the present invention, an upper end of the guide may extend obliquely upward from the front side toward the rear side. With this configuration, the article, having collided with the erector at the time of transfer, is able to be smoothly guided obliquely upward.

In an article placement apparatus according to a preferred embodiment of the present invention, at least a portion of a vertically upper end of the erector is provided with an overhang portion that horizontally extends from the upper end and restricts vertical movement of a portion of the article. With this configuration, it is possible to prevent the obliquely upward movement of the article placed on the support, and to prevent falling of the article from the article placement apparatus.

In an article placement apparatus according to a preferred embodiment of the present invention, a rear end portion of the upper end of the guide may be provided at a position vertically higher than the overhang portion. With this configuration, it is possible to prevent the storage container guided by the guide from colliding with the overhang portion.

A stocker according to a preferred embodiment of the present invention may include columns arranged at predetermined intervals in the width direction and extending vertically, and an article placement apparatus according to a preferred embodiment of the present invention. The erector of the article placement apparatus may be fixed to the column. With this configuration, even when the article placement apparatus of the stocker is provided with the erector, it is possible to prevent the article from being damaged at the time of placement of the article.

According to a transport vehicle system according to a preferred embodiment of the present invention may include an article placement apparatus according to a preferred embodiment of the present invention, a transfer device that transfers the article onto the article placement apparatus, a controller that controls the transfer device, and a detector that detects obliquely upward movement of the article from the front side toward the rear side. The controller may stop the transfer of the article by the transfer device when the detector detects the obliquely upward movement of the article. With this configuration, when the detector detects the obliquely upward movement of the article, that is, when the detector detects the contact of the article with the erector, the transfer device pushes the article in the transfer direction. It is thus possible to prevent the article from being damaged in advance.

In a detector of a transport vehicle system according to a preferred embodiment of the present invention, the detector may be provided in a support that supports the article at the time of transfer and includes a sensor that detects the presence or absence of the article. With this configuration, it is possible to easily provide a detector capable of detecting the obliquely upward movement.

According to preferred embodiments of the present invention, even when the erector vertically erecting from the support is provided, it is possible to prevent the article from being damaged at the time of placement of the article.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
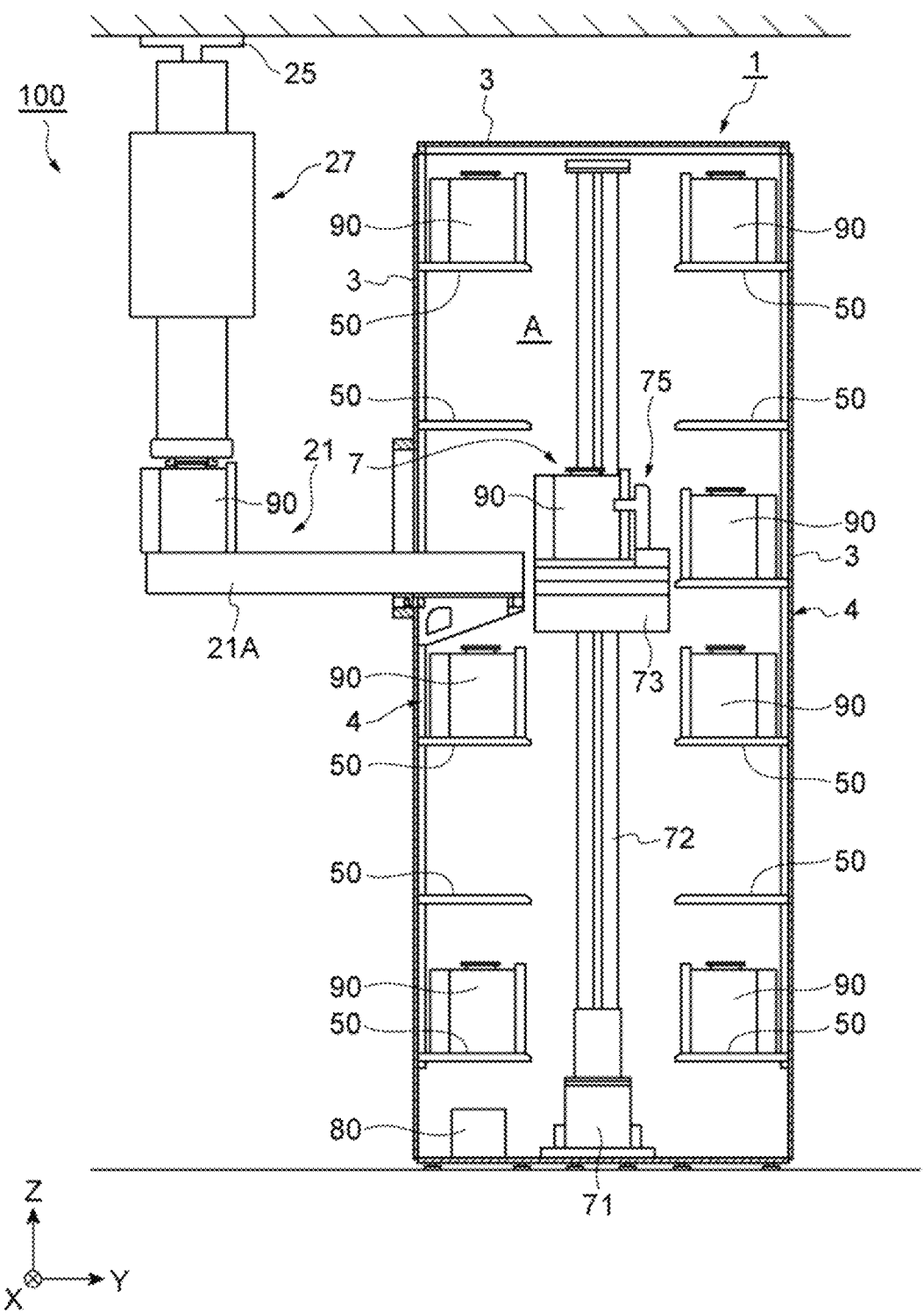
FIG. 1 is a sectional view illustrating a stocker according to a preferred embodiment of the present invention, seen from an X direction.

Hereinafter, preferred embodiments of the present invention will be described in detail with reference to the drawings. In descriptions of the drawings, the same elements are provided with the same reference numerals, and a repeated description will be omitted.

An article placement apparatus 50 according to a preferred embodiment of the present invention, a stocker 1 including an article placement apparatus 50, and a transport vehicle system 100 will be described. First, the stocker 1 will be described. The stocker 1 has a function as a storage to store a storage container (an article) 90 such as a front opening unified pod (FOUP) in which articles to be stored such as semiconductor wafers and glass substrates are stored. The stocker 1 is provided, for example, in a clean room.

As illustrated in FIG. 1, the stocker 1 mainly includes a main body 3, a rack 4, a stacker crane (a transfer device) 7, an OHT port 21, and a controller (a controller) 80.

The first main body 3 is a portion that defines an internal space A of the stocker 1 and includes a plurality of partitions. The rack 4 is a portion on which the storage container 90 is placed, and is generally provided in one or two rows (here, two rows). Each rack 4 extends in the X direction (the width direction) and is disposed in parallel or substantially in parallel so that two adjacent racks 4, 4 face each other.

Figure 2:
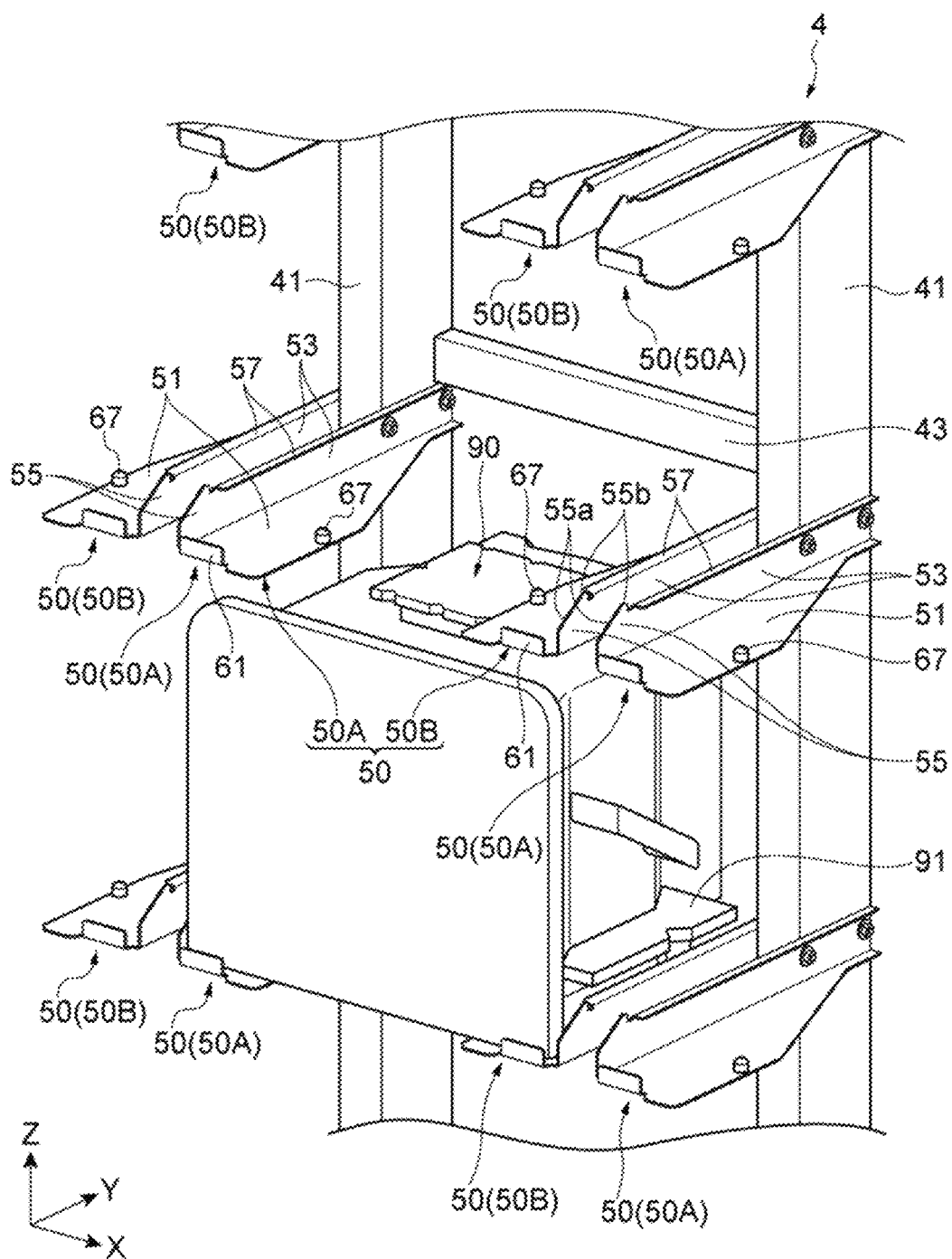
FIG. 2 is an enlarged perspective view illustrating a portion of an article placement apparatus included in the stocker of FIG. 1.
Figure 3:
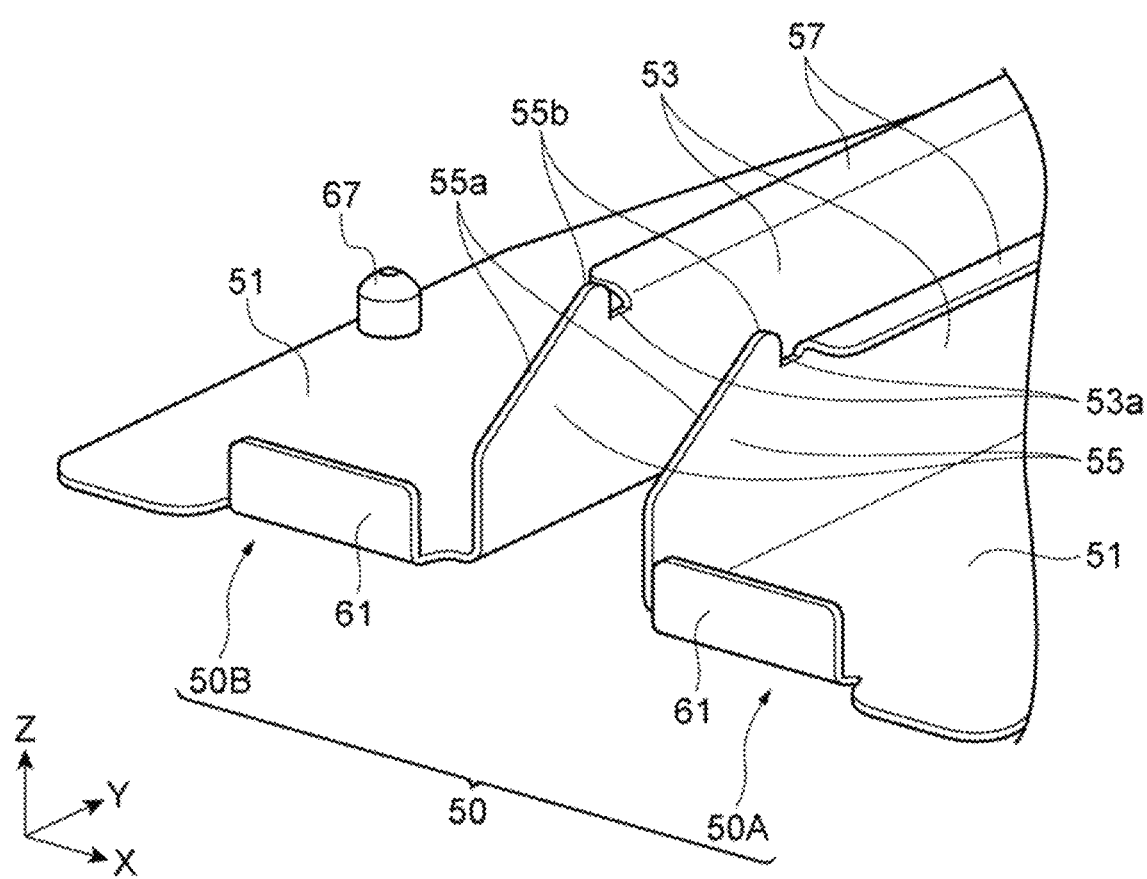
FIG. 3 is an enlarged perspective view illustrating a portion of the article placement apparatus of FIG. 2.

As illustrated in FIGS. 2 and 3, each rack 4 includes a column 41, a beam 43, and an article placement apparatus 50. In FIGS. 2 and 3, a description will be given assuming that the side on which the stacker crane (the transfer device) 7 is disposed as viewed from the article placement apparatus 50 is the front side, and the side opposite to the front side is the rear side in the transfer direction. The columns 41 are disposed at predetermined intervals in the X direction and extend vertically. The beam 43 connects the adjacent columns 41, 41 to each other. The article placement apparatuses 50 are arranged along the X direction and the Z direction (the vertical direction). On the article placement apparatus 50, the storage container 90 is placed and stored.

The article placement apparatus 50 preferably includes a pair of right and left article placement apparatuses 50A, 50B. That is, one storage container 90 is placed on the pair of right and left article placement apparatuses 50A, 50B. The article placement apparatus 50 includes a support 51, a side erector (an erector) 53, and a front erector 61.

The support 51 is a portion on which the storage container 90 is placed. A container positioner 67 is provided on the top surface of the support 51. The container positioner 67 positions the storage container 90. The container positioner 67 positions the storage container 90 by being fitted into a recess in the bottom surface of the storage container 90. The side erector 53 erects in the vertical direction from the support 51 and extends in the transfer direction (the X direction) of the storage container 90. The side erector 53 restricts the storage container 90 placed on the support 51 from moving in the width direction (the X direction) that is horizontally orthogonal to the transfer direction. The side erector 53 is provided with a guide 55 and an overhang portion 57.

The guide 55 is a portion that guides the storage container 90 obliquely upward from the front side toward the rear side in the Y direction when the storage container 90 transferred by the stacker crane 7 comes into contact with the guide 55. An upper end (a guide surface) 55a of the guide 55 extends obliquely upward from the front side toward the rear side. The overhang portion 57 extends horizontally from a vertically upper end 53a of the side erector 53 and regulates the vertical movement of a lateral protrusion 91 which is a part of the storage container 90 placed on the support 51. A rear end 55b of the upper end 55a of the guide 55 is provided at a position higher than the overhang portion 57 in the Z direction.

The front erector 61 erects in the Z direction from the support 51 and also extends in the X direction. The front erector 61 restricts the storage container 90 placed on the support 51 from horizontally moving forward in the Y direction.

The article placement apparatus 50 including the support 51, the side erector 53, the guide 55, the overhang portion 57, and the front erector 61, is integrally formed by, for example, press processing a plate-shaped member.

Figure 4:
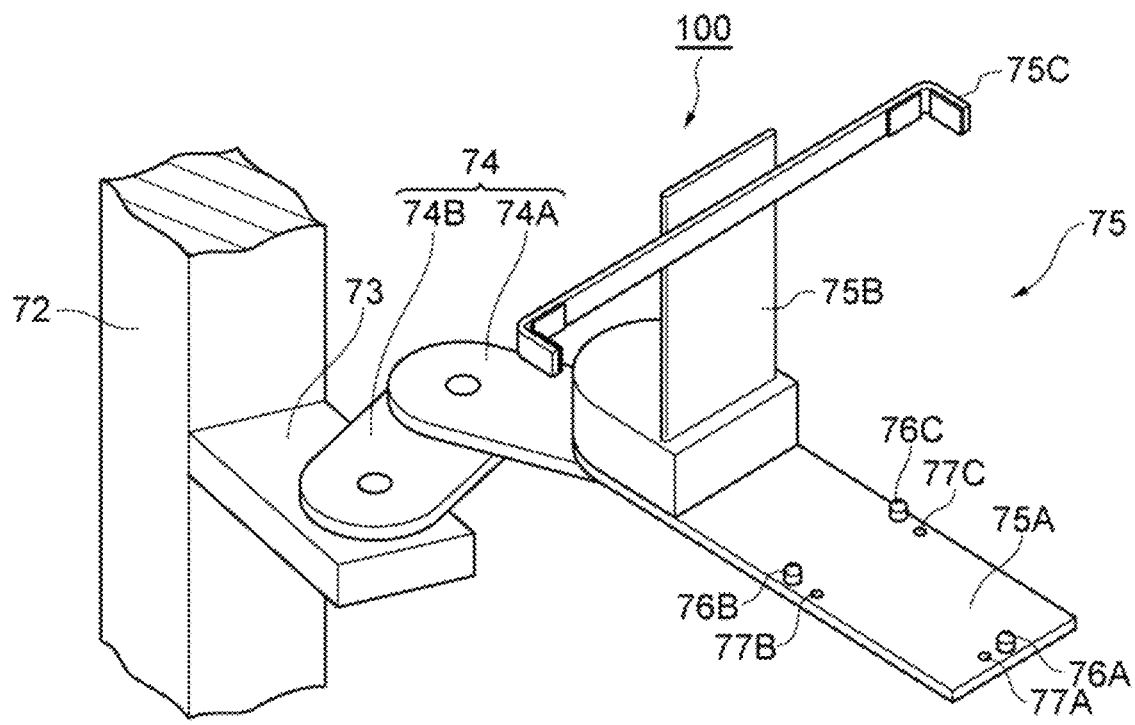
FIG. 4 is an enlarged perspective view illustrating the vicinity of an arm and a container support of a stacker crane of FIG. 1.

As illustrated in FIGS. 1 and 4, the stacker crane 7 is a mechanism that loads and unloads the storage container 90 onto and from the article placement apparatus 50 and moves the storage container 90 between the article placement apparatuses 50. The stacker crane 7 is disposed in an area sandwiched by the racks 4, 4 facing each other. The stacker crane 7 can travel along a track (not illustrated) disposed on the floor surface along the extending direction (the X direction) of the rack 4, thus moving in the X direction along the rack 4.

Figure 5:
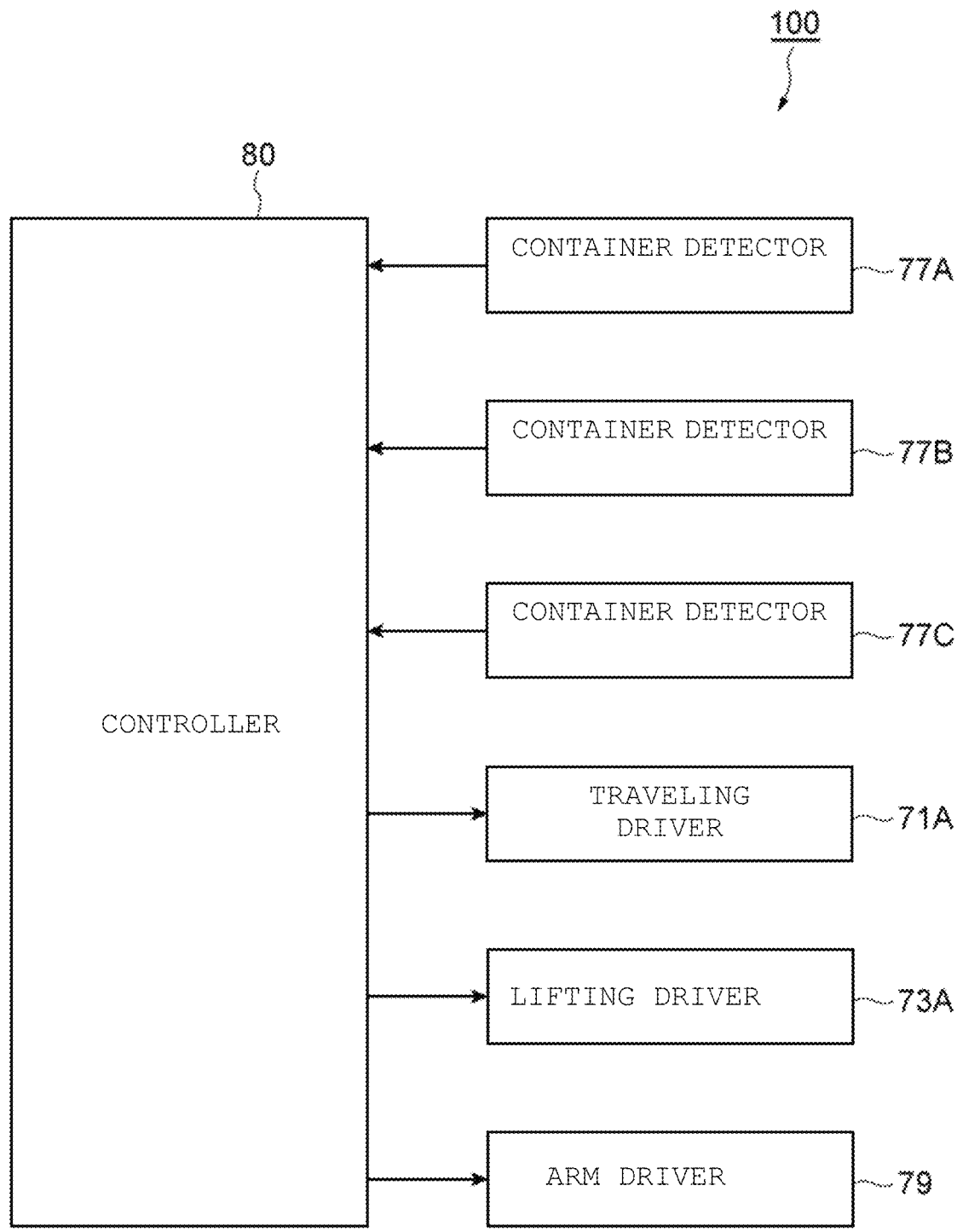
FIG. 5 is a functional block diagram illustrating a functional configuration of the transport vehicle system of FIG. 1.

The stacker crane 7 includes a traveler 71, a support column 72, a loading platform 73, an arm 74, and a container support 75. The traveler 71 is able to travel on the track in the X direction by a traveling driver 71A (cf. FIG. 5) such as a motor. The support column 72 is provided on the upper portion of the traveler 71 and extends vertically. The loading platform 73 is movable up and down along the support column 72 by a lifting driver 73A (cf. FIG. 5) such as a motor. The arm 74 is provided on the loading platform 73 and includes a plurality of arms 74A, 74B. To the uppermost arm 74B of the plurality of arms 74A, 74B, a container support 75 is fixed. The plurality of arms 74A, 74B can freely move the container support 75 horizontally with an arm driver 79 (cf. FIG. 5) such as a motor.

The container support 75 holds the storage container 90 and is fixed to the upper surface of the arm 74B. The container support 75 includes a first main body 75A, a second main body 75B, a container holder 75C, container positioners 76A, 76B, 76C, and container detectors (detectors) 77A, 77B, 77C. The first main body 75A is a plate-shaped member and is fixed to the arm 74B and supports the storage container 90. The second main body 75B extends upward in the vertical direction from the first main body 75A and supports the container holder 75C. The container holder 75C holds the side of the storage container 90.

The container positioners 76A, 76B, 76C are located on the top surface of the first main body 75A and position the storage container 90. The container positioners 76A, 76B, 76C position the storage container 90 by being fitted into recesses on the bottom surface of the storage container 90. Three container positioners 76A, 76B, 76C are provided on the upper surface of the first main body 75A. The container positioners 76A, 76B, 76C are provided at positions close to the peripheral edge of the first main body 75A.

The container detectors 77A, 77B, 77C are, for example, contact sensors and detect whether the storage container 90 is in contact. The container detectors 77A, 77B, 77C output, to the controller 80, information regarding the presence or absence of contact of the storage container 90. Three container detectors 77A, 77B, 77C are arranged on the upper surface of the first main body 75A. The container detectors 77A, 77B, 77C are arranged at positions close to the peripheral edge of the first main body 75A and in the vicinity of the container positioners 76A, 76B, 76C.

Loading and unloading of the storage container 90 onto and from the stocker 1 is performed by an overhead hoist transfer (OHT) port 21. The OHT port 21 is a portion in which the storage container 90 is delivered between an overhead traveling vehicle 27 traveling on a track 25 laid on a ceiling and the stocker 1, and the OHT port 21 includes a conveyor 21A to transport the storage container 90.

Next, the transport vehicle system 100 will be described. The transport vehicle system 100 includes the stocker 1 and the controller 80.

The controller 80 (cf. FIG. 1) controls each element of the stacker crane 7. The controller 80 is disposed, for example, inside the main body 3. The controller 80 includes a central processing unit (CPU), a random access memory (RAM), a read only memory (ROM), and the like. The controller 80 executes various controls by the cooperation of hardware such as the CPU, the RAM, and the ROM, and software such as a program.

As illustrated in FIG. 4, the controller 80 of the present preferred embodiment stops the transfer of the storage container 90 by the stacker crane 7 when the container detectors 77A, 77B, 77C detect the obliquely upward movement of the storage container 90. Specifically, when at least one of the container detectors 77A, 77B, 77C detects that the storage container 90 is not present, the controller 80 determines that the obliquely upward movement of the storage container 90 has been detected by the container detectors 77A, 77B, 77C, and stops the transfer of the storage container 90 by the stacker crane 7.

Next, an operation at the time when the stacker crane 7 places the storage container 90 on the article placement apparatus 50 will be described. The controller 80 controls the traveling driver 71A so as to stop the traveler 71 in front of the article placement apparatus 50 on which the storage container 90 is to be placed in the X direction. At the same time, the controller 80 controls the lifting driver 73A so as to move the container support 75 to the height of the article placement apparatus 50 on which the storage container 90 is to be placed. More specifically, a bottom surface 90a of the storage container 90 moves the container support 75 to such a height that the storage container 90 can pass above the front erector 61 of the article placement apparatus 50 on which the storage container 90 is to be placed.

Subsequently, the controller 80 controls the arm driver 79 so as to extend the arm 74 to the rear side in the Y direction and advance the storage container 90 supported from below by the first main body 75A. Then, when the rear end 90b (cf. FIGS. 5 and 6) in the forward direction of the storage container 90 exceeds the front erector 61, the arm driver 79 is stopped. Next, the controller 80 controls the lifting driver 73A so as to lower the container support 75. Thus, the storage container 90 is placed on the article placement apparatus 50.

Next, a description will be given of a case where the storage container 90 stops at a position shifted in the X direction from the position of the article placement apparatus 50 on which the storage container is to be placed, for some reason. In this case as well, the controller 80 controls the lifting driver 73A so as to move the container support 75 to the height of the article placement apparatus 50 on which the storage container 90 is to be placed.

Figure 6:
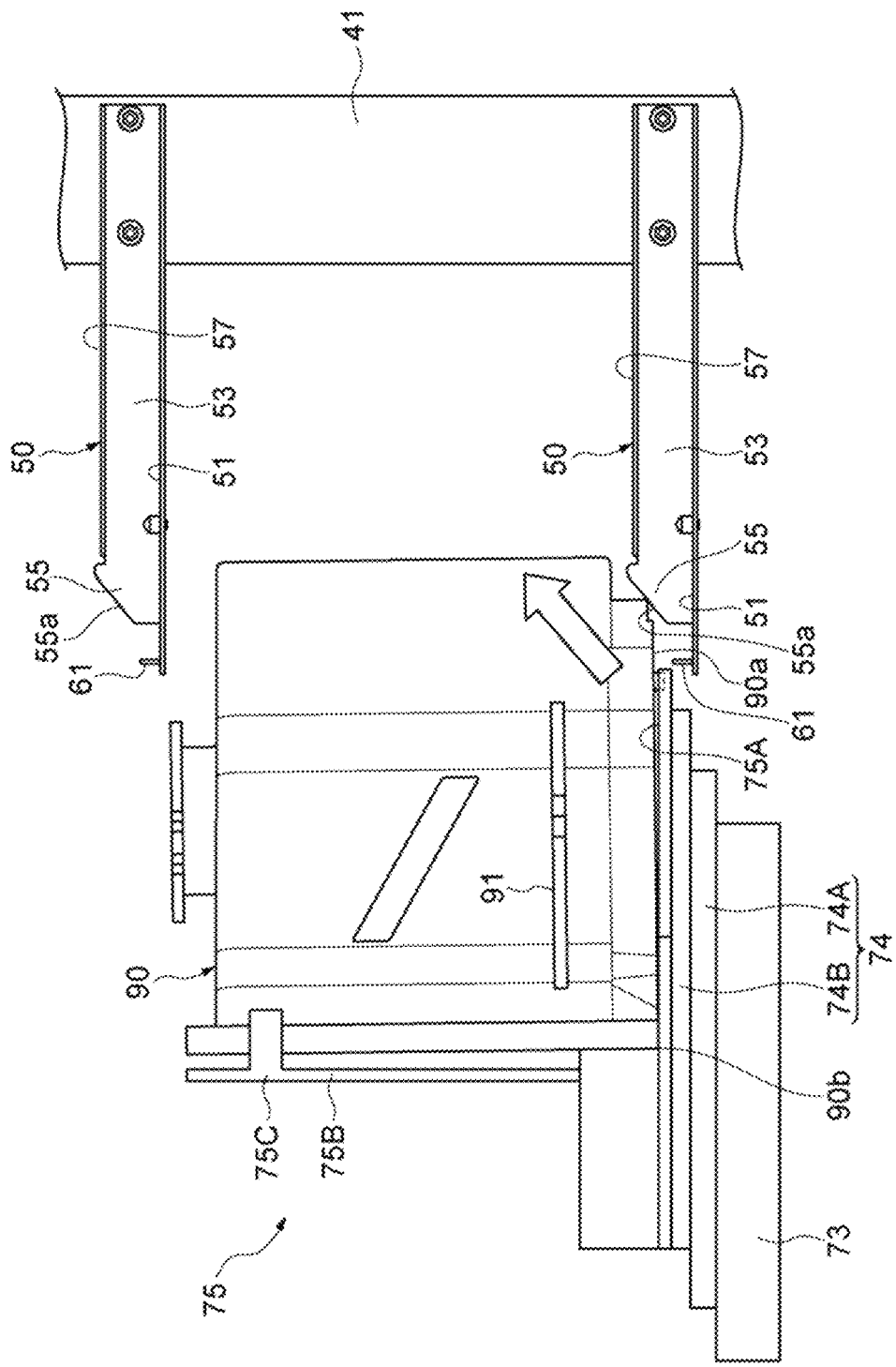
FIG. 6 is a side view illustrating a storage container in contact with a side erector.

Next, the controller 80 controls the arm driver 79 so as to extend the arm 74 to the rear side in the Y direction and advance the storage container 90 supported from below by the first main body 75A. At this time, the storage container 90 is in contact with the guide 55 of the side erector 53 as illustrated in FIG. 6. The storage container 90 comes into contact with the upper end 55a and guides the bottom surface 90a of the storage container 90 obliquely upward from the front side toward the rear side.

Figure 7:
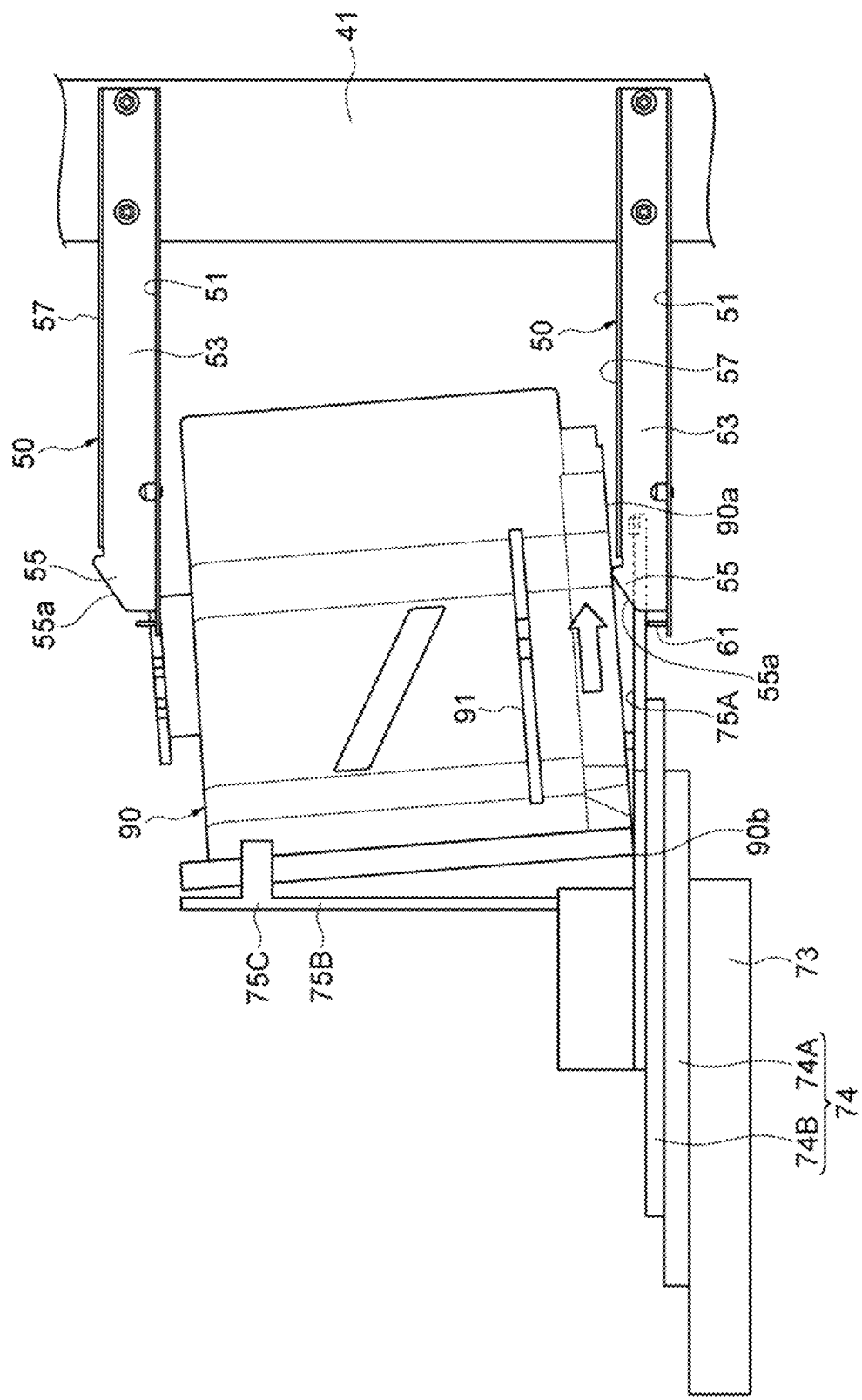
FIG. 7 is a side view illustrating the storage container in contact with the side erector.
Figure 8:
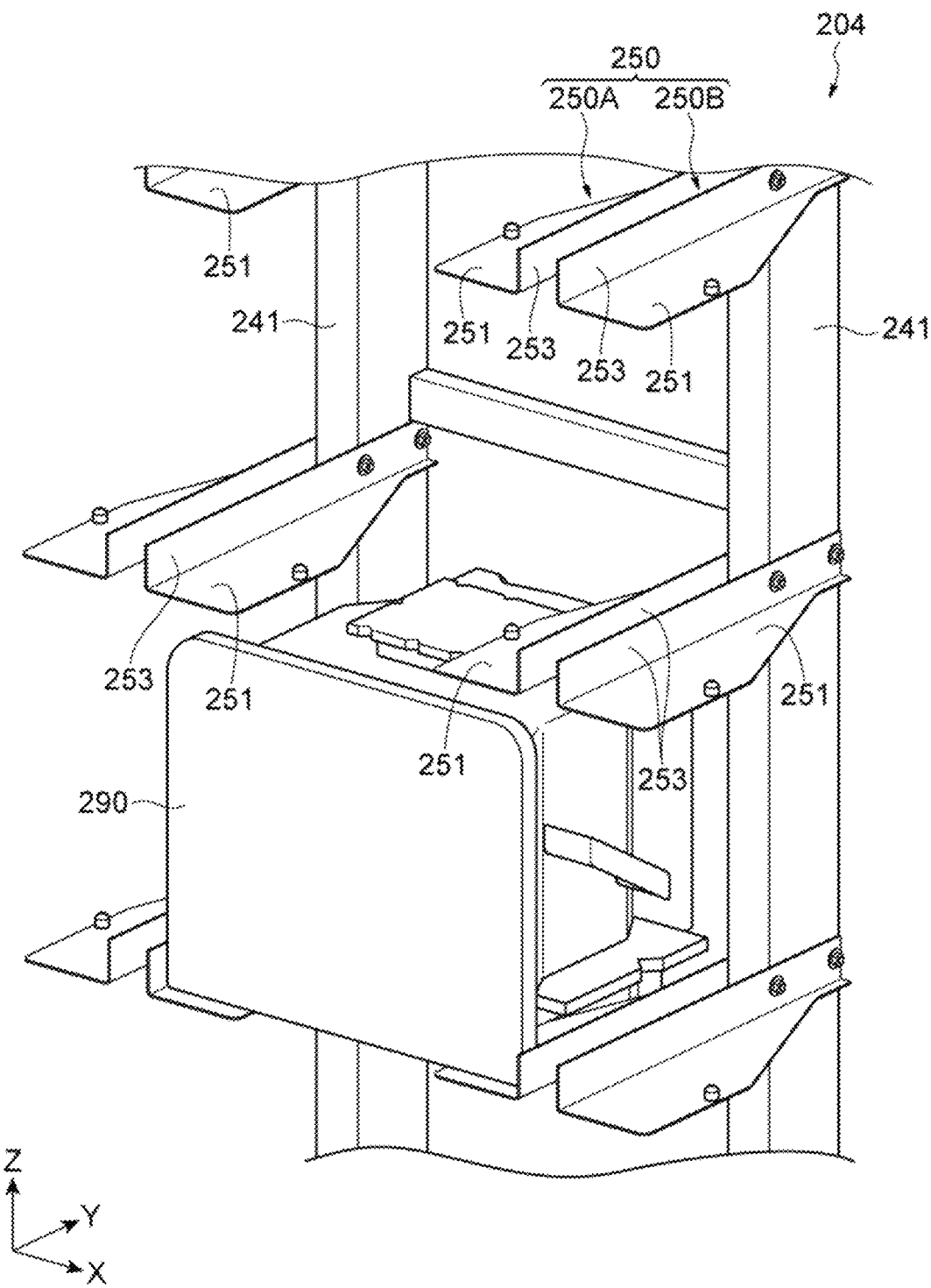
FIG. 8 is an enlarged perspective view illustrating a portion of an article placement apparatus included in a conventional stocker.

As illustrated in FIG. 7, the storage container 90 is guided obliquely upward from the front side toward the rear side so that the bottom surface 90a of the storage container 90 slides on the guide surface and separates from the container support 75. At this time, a container detector 77A disposed at the forefront in the traveling direction of the container support 75 detects that the storage container 90 is in a non-contact state. When the container detector 77A detects that the storage container 90 is in the non-contact state, the controller 80 stops the drive of the arm driver 79 and stops the transfer of the storage container 90 by the stacker crane 7.

In the article placement apparatus 50 according to the above preferred embodiment, when the stacker crane 7 stops in the state of being shifted in the X direction with respect to a position of the article placement apparatus 50 where the stacker crane 7 is to stop and the storage container 90 is transferred in that state, the guide 55 guides the storage container 90 obliquely upward from the front side toward the rear side (cf. FIG. 6). As a result, the storage container 90 is prevented from being pinched between the container support 75 and the side erector 53 and damaged. As a result, even when the side erector 53 vertically erecting from the support 51 is provided, it is possible to prevent the storage container 90 from being damaged at the time of placement of the storage container 90.

In the article placement apparatus 50 according to the above preferred embodiment, the upper end 55a of the guide 55 extends obliquely upward from the front side toward the rear side. Thus, the storage container 90 having come into contact with the side erector 53 at the time of transfer of the storage container 90 is able to be smoothly guided obliquely upward.

Since the overhang portion 57 horizontally extending from the upper end 53a is provided in the side erector 53 of the article placement apparatus 50 according to the above preferred embodiment, it is possible to prevent the storage container 90 from moving vertically upward. It is thus possible to prevent the fall of the storage container 90 from the article placement apparatus 50.

As illustrated in FIG. 3, the rear end 55b of the upper end 55a of the guide 55 provided in the side erector 53 of the article placement apparatus 50 according to the above preferred embodiment is provided at a position vertically higher than the overhang portion 57 It is thus possible to prevent the storage container 90 guided by the guide 55 from colliding with the overhang portion 57.

The stocker 1 according to the above preferred embodiment is able to prevent the storage container 90 from being damaged at the time of the placement of the storage container even when the side erector 53 is provided on the article placement apparatus 50 of the stocker 1.

The controller 80 of the transport vehicle system 100 according to the above preferred embodiment stops the transfer of the storage container 90 by the stacker crane 7 when the container detectors 77A, 77B, 77C detect the obliquely upward movement of the storage container 90. As a result, when the storage container 90 is detected to have moved obliquely upward by the container detectors 77A, 77B, 77C, that is, when the storage container 90 is detected to have come into contact with the side erector 53, the stacker crane 7 stops pushing the storage container 90 in the Y direction. Thus, damage to the storage container 90 is able to be prevented in advance.

The container detectors 77A, 77B, 77C of the transport vehicle system 100 according to the above preferred embodiment are provided by the first main body 75A supporting the storage container 90 at the time of transfer, and includes sensors detecting the presence or absence of the storage container 90. It is thus possible to easily provide the container detectors 77A, 77B, 77C to detect the obliquely upward movement of the storage container 90.

Although preferred embodiments have been described above, the present invention is not limited to the above preferred embodiments, and various changes can be made in a range not deviating from the gist of the present invention.

In the above preferred embodiments, the description has been given by the example where the article placement apparatus 50 (50A, 50B) of the present application is provided on the rack 4 of the stocker 1. However, the article placement apparatus 50 (50A, 50B) may be provided in a load port as an interface portion in which the storage container is delivered to the stocker as described above or a predetermined processing device. Even in this case, it is possible to prevent the storage container 90 from being damaged at the time of the placement of storage container 90.

The article placement apparatuses 50 according to the above preferred embodiments and alternative preferred embodiments have been described by the examples including the pair of article placement apparatuses 50A, 50B. However, the article placement apparatus 50 may be configured to have the erector provided on a flat plate-shaped member where the storage container 90 can be placed.

The guide 55 of article placement apparatus 50 according to the above preferred embodiments and alternative preferred embodiments has been described by example as including an upper end extending obliquely upward from the front side toward the rear side along the transfer direction. However, for example, the article placement apparatus 50 may have an arc shape such that an angle with the horizontal surface gradually becomes loose. Even in this case, the storage container 90 in contact with the side erector 53 is able to be guided obliquely upward.

Although the description has been given by way of example where the guide 55 of the article placement apparatus 50 according to the above preferred embodiments and alternative preferred embodiments is provided with the overhang portion 57 and the front erector 61. However, both or one of the overhang portion 57 and the front erector 61 may not be provided in the side erector 53.

Although the description has been given by way of example where the container support 75 of the article placement apparatus according to the above preferred embodiment and alternative preferred embodiment is provided with the three container detectors 77A, 77B, 77C. However, the number of the container detectors 77A, 77B, 77C may be one, two, four, or greater.

Further, preferred embodiments of the present invention are also applied to a transfer device having a configuration different from that of the stacker crane described above. That is, preferred embodiments of the present invention may also be applied to a conveyance device capable of moving the transferor either horizontally or vertically, and can also be applied to a conveyance device capable of moving the transferor horizontally along a track laid near the ceiling instead of being laid on the floor surface, or some other device.

In the above preferred embodiments and alternative preferred embodiments, the storage container such as the FOUP has been described as an example of the article, but a reticle pod for storing a reticle may be used. Moreover, articles such as a cardboard box and a reusable container may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An article placement apparatus onto which an article is transferred by a transfer device, the article placement apparatus comprising:
   a support on which the article is placed; and
   an erector that vertically erects from the support, the erector extends in a transfer direction of the article, and restricts the article placed on the support from moving in a width direction that is horizontally orthogonal to the transfer direction; wherein when a side on which the transfer device is disposed as viewed from the article placement apparatus is taken as a front side in the transfer direction and a side opposite to the front side is taken as a rear side in the transfer direction, the erector is provided with a guide that guides the article obliquely upward from the front side toward the rear side at a time when the article transferred by the transfer device comes into contact with the guide.

2. The article placement apparatus according to claim 1, wherein an upper end of the guide extends obliquely upward from the front side toward the rear side.

3. The article placement apparatus according to claim 1, wherein at least a portion of a vertically upper end of the erector is provided with an overhang portion that horizontally extends from the upper end and regulates vertical movement of a portion of the article.

4. The article placement apparatus according to claim 3, wherein a rear end portion of the upper end of the guide is provided at a position vertically higher than the overhang portion.

5. A stocker comprising:
columns arranged at predetermined intervals in a width direction and extending vertically; and
the article placement apparatus according to claim 1; wherein
the erector of the article placement apparatus is fixed to the column.

6. A transport vehicle system comprising:
the article placement apparatus according to claim 1;
a transfer device that transfers the article onto the article placement apparatus;
a controller that controls the transfer device; and
a detector that detects obliquely upward movement of the article from the front side toward the rear side; wherein
the controller stops the transfer of the article by the transfer device when the detector detects the obliquely upward movement of the article.

7. The transport vehicle system according to claim 6, wherein the detector is provided in the support that supports the article at a time of transfer and includes a sensor that detects presence or absence of the article.

* * * * *